(12) United States Patent
Kon (10) Patent No.: US 10,422,037 B2
(45) Date of Patent: Sep. 24, 2019

(54) FILM FORMATION APPARATUS AND FILM FORMATION METHOD

(71) Applicant: TOPPAN PRINTING CO., LTD., Tokyo (JP)

(72) Inventor: Masato Kon, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/457,443

(22) Filed: Mar. 13, 2017

(65) Prior Publication Data

US 2017/0183774 A1 Jun. 29, 2017

Related U.S. Application Data

(63) Continuation of application No. PCT/JP2015/076527, filed on Sep. 17, 2015.

(30) Foreign Application Priority Data

Sep. 19, 2014 (JP) .................................. 2014-191090

(51) Int. Cl.

| C23C 16/54 | (2006.01) |
|---|---|
| C23C 16/455 | (2006.01) |
| C23C 16/44 | (2006.01) |
| C23C 16/52 | (2006.01) |

(52) U.S. Cl.
CPC .... *C23C 16/45544* (2013.01); *C23C 16/4412* (2013.01); *C23C 16/45551* (2013.01); *C23C 16/52* (2013.01); *C23C 16/545* (2013.01)

(58) Field of Classification Search
CPC .................................................... C23C 16/545
See application file for complete search history.

(56) References Cited

U.S. PATENT DOCUMENTS

| 4,420,385 A | 12/1983 | Hartsough |
| 6,186,090 B1 | 2/2001 | Dotter, II et al. |
| 2001/0016364 A1* | 8/2001 | Loan ........................ C23C 16/44 438/14 |

(Continued)

FOREIGN PATENT DOCUMENTS

| EP | 3208363 A1 | 8/2017 |
| JP | S59-179783 A | 10/1984 |

(Continued)

OTHER PUBLICATIONS

International Search Report issued in International Patent Application No. PCT/JP2015/076527 dated Dec. 22, 2015.

(Continued)

*Primary Examiner* — Joseph A Miller, Jr.
(74) *Attorney, Agent, or Firm* — Foley & Lardner LLP (57) ABSTRACT

A film formation apparatus and a film formation method that can homogenize the distribution of gas in each zone in a chamber and improve film formation precision are provided. A film formation apparatus according to one embodiment includes: a chamber which includes a plurality of zones into which gas is introduced, and a plurality of discharge ports that discharge the gas located in at least any of the zones and that can individually adjust an opening state; and a transportation unit that transports a substrate so as to pass through the plurality of zones in the chamber.

9 Claims, 4 Drawing Sheets

(56) References Cited

U.S. PATENT DOCUMENTS

| | | | |
|---|---|---|---|
| 2001/0023971 A1* | 9/2001 | Kondo | C23C 16/24 257/458 |
| 2007/0068794 A1 | 3/2007 | Lippey et al. | |
| 2007/0224348 A1* | 9/2007 | Dickey | C23C 16/45551 427/248.1 |
| 2007/0281089 A1 | 12/2007 | Heller et al. | |
| 2009/0272322 A1 | 11/2009 | Fujinami et al. | |
| 2009/0291209 A1* | 11/2009 | Granneman | C23C 16/45551 427/255.5 |
| 2010/0078312 A1 | 4/2010 | Mullapudi et al. | |
| 2010/0140078 A1 | 6/2010 | Pinarbasi et al. | |
| 2010/0189900 A1 | 7/2010 | Dickey et al. | |
| 2010/0264017 A1 | 10/2010 | Nam et al. | |
| 2011/0159186 A1 | 6/2011 | Yu et al. | |
| 2012/0141676 A1* | 6/2012 | Sershen | C23C 16/45551 427/255.23 |
| 2012/0171371 A1 | 7/2012 | Dickey et al. | |
| 2012/0219708 A1 | 8/2012 | Dickey et al. | |
| 2013/0186547 A1 | 7/2013 | Fujino et al. | |
| 2014/0326182 A1 | 11/2014 | Wang et al. | |
| 2017/0211177 A1 | 7/2017 | Kon | |

FOREIGN PATENT DOCUMENTS

| | | |
|---|---|---|
| JP | H07-176481 A | 7/1995 |
| JP | H09-307128 A | 11/1997 |
| JP | H10-11026 A | 4/1998 |
| JP | 2001-073133 | 3/2001 |
| JP | 2006-183145 A | 7/2006 |
| JP | 2007-063639 A | 3/2007 |
| JP | 2008-507629 A | 3/2008 |
| JP | 2010-242150 A | 10/2010 |
| JP | 2011-504546 A | 2/2011 |
| JP | 2011-096986 A | 5/2011 |
| JP | 2012-077330 A | 4/2012 |
| JP | 2013-234365 A | 11/2013 |
| JP | 2014-027191 A | 2/2014 |
| WO | WO-2007/112370 A1 | 10/2007 |

OTHER PUBLICATIONS

Extended European Search Report dated Apr. 17, 2018 in corresponding application No. 15850658.4.
Extended European Search Report dated Feb. 26, 2018 in corresponding application No. 15842589.
International Search Report issued in International Application No. PCT/JP2016/001388 dated Apr. 12, 2016.
Written Opinion issued in International Application No. PCT/JP2016/001388 dated Apr. 12, 2016.
Written Opinion issued in International Application No. PCT/JP2015/076527 dated Dec. 22, 2015.
International Search Report issued in International Application No. PCT/JP2015/005176 dated Jan. 12, 2016.
Written Opinion issued in International Application No. PCT/JP2015/005176 dated Jan. 12, 2016.
Japanese Office Action dated Mar. 14, 2019 in corresponding application No. 2015-053394.
Extended European Search Report dated Oct. 11, 2018 in corresponding European Application No. 16764465.7, 9 pps.
Japanese Office Action dated Oct. 23, 2018 in corresponding application No. 2014-210299.

* cited by examiner

FILM FORMATION APPARATUS AND FILM FORMATION METHOD

CROSS-REFERENCE TO RELATED PATENT APPLICATIONS

This application is a continuation application filed under 35 U.S.C. § 111(a) claiming the benefit under 35 U.S.C. §§ 120 and 365(c) of International Application No. PCT/JP2015/076527, filed on Sep. 17, 2015, which is based upon and claims the benefit of priority of Japanese Patent Application No. 2014-191090, filed on Sep. 19, 2014, the entireties of which are hereby incorporated by reference.

TECHNICAL FIELD

The present invention relates to film formation apparatuses and film formation methods.

BACKGROUND

Atomic layer deposition has been proposed as an example of a film formation method. Atomic layer deposition, which is referred to as ALD, is a film formation process in which layers are deposited in a layer-by-layer manner at an atomic level by chemically reacting the substances which are adsorbed on the surface. A highly reactive gas, which is referred to as a precursor, and a reactive gas are alternately used to perform adsorption on the substrate surface and chemical reactions subsequent to the adsorption to thereby grow thin layers in a layer-by-layer manner at an atomic level. The reactive gas is also called a precursor in the ALD process.

Specifically, by using a self-limiting effect in surface adsorption that prohibits a certain type of gas from being adsorbed onto a surface after the surface is covered by the gas, only one layer of precursor is adsorbed onto the surface and unreacted precursor is purged. Then, the reactive gas is introduced to oxidize or reduce the above precursor to thereby obtain one thin layer having a desired composition. After that, the reactive gas is purged. This cycle is repeated so as to grow thin layers in a layer-by-layer manner. Accordingly, the thin layers grow in two dimensions in the ALD process. The ALD is characterized by having fewer defects in film formation, and is expected to be applied to various fields.

In the ALD process, a film formation apparatus and a film formation method of a time-divided type have been proposed, in which supply and discharge of precursors are repeatedly performed in a single chamber. The film formation apparatus and the film formation method of a time-divided type have a problem of a slow speed of film formation, since one layer is deposited in each cycle at an atomic level.

In order to solve the above problem, a space-divided type has been proposed, in which the chamber is divided into a several zones (areas) so that a single precursor or purge gas is supplied into the respective zones while the substrate is reciprocated among the zones (e.g., see PTL 1). The ALD process of a space-divided type significantly improves the speed of film formation.

In the space-divided type ALD process, a flexible substrate is typically transported along a predetermined transportation path in a chamber while being reciprocated among the zones. In the chamber, each zone has at least one supply port that supplies gas and one discharge port that discharges gas so that the gas is supplied and discharged to be distributed at a desired concentration.

CITATION LIST

Patent Literature

[PTL 1] WO 2007/112370

SUMMARY OF THE INVENTION

Technical Problem

However, if the gas is non-uniformly distributed in the chamber, the zones in the chamber have an area in which the gas is not sufficiently supplied. This causes difficulty in achieving saturated adsorption of the precursor across the entire surface of the substrate. As a consequence, the film thickness may vary depending on the sites on the substrate.

According to one embodiment of the present invention, a film formation apparatus is characterized in that the film formation apparatus includes: a chamber which includes a plurality of zones into which gas is introduced, and a plurality of discharge ports that discharge the gas located in at least any of the zones and that can individually adjust an opening state; and a transportation unit that transports a substrate so as to pass through the plurality of the zones in the chamber.

According to one embodiment of the present invention, a film formation method is characterized in that the film formation method includes: in a chamber which includes a plurality of zones into which gas is introduced, and a plurality of discharge ports that discharge the gas located in at least any of the zones and that can individually adjust an opening state, introducing the gas into the plurality of zones; and transporting the substrate in the chamber so as to pass through the plurality of the zones.

Advantageous Effects of Invention

According to the film formation apparatus and the film formation method of the embodiment of the present invention, the distribution of gas in each zone in the chamber can be better homogenized, thereby improving film formation precision.

DESCRIPTION OF REPRESENTATIVE EMBODIMENTS

[Representative Embodiment]

Figure 1:
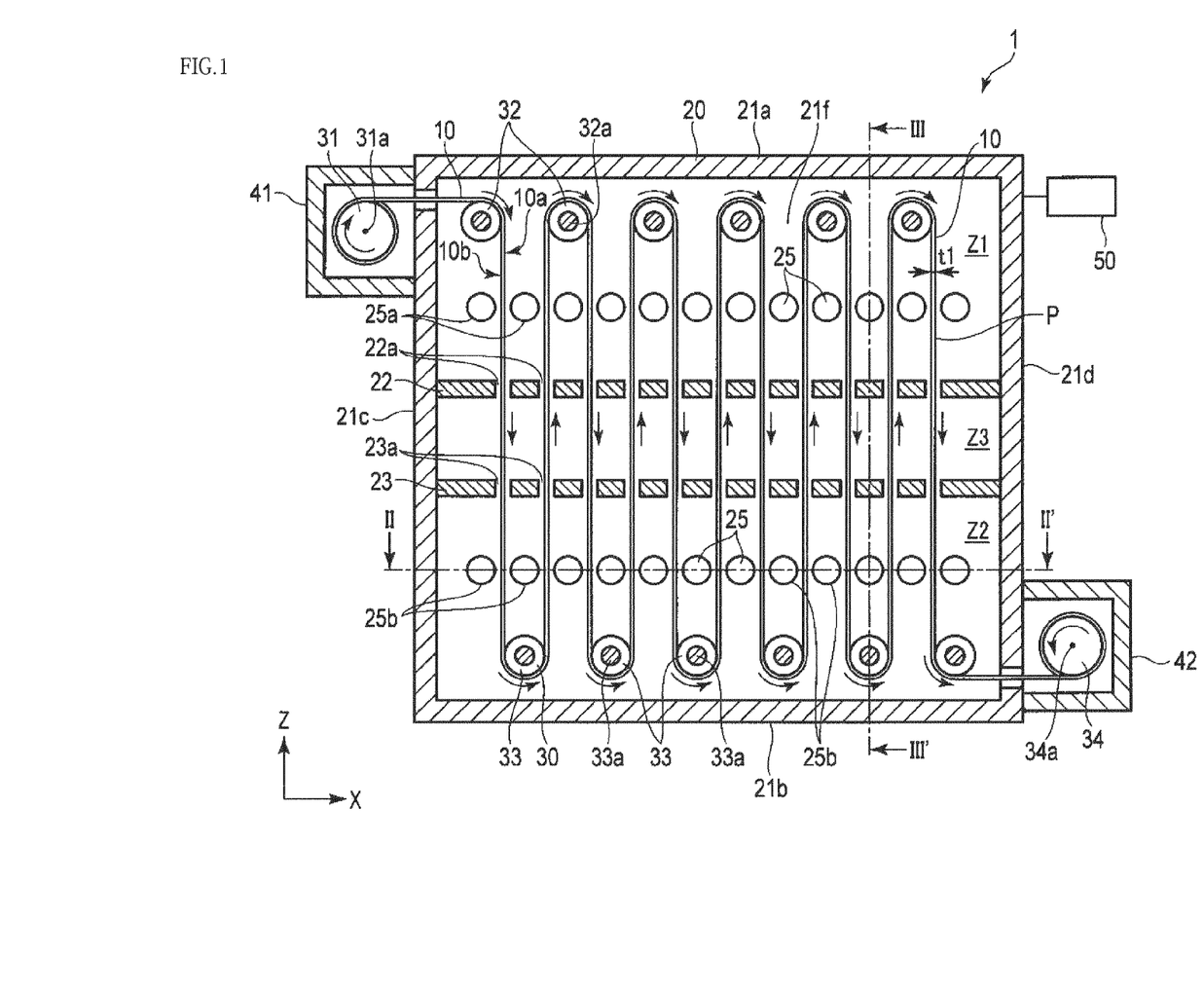
FIG. 1 is a cross sectional view of a film formation apparatus according to an embodiment of the present invention.
Figure 2:
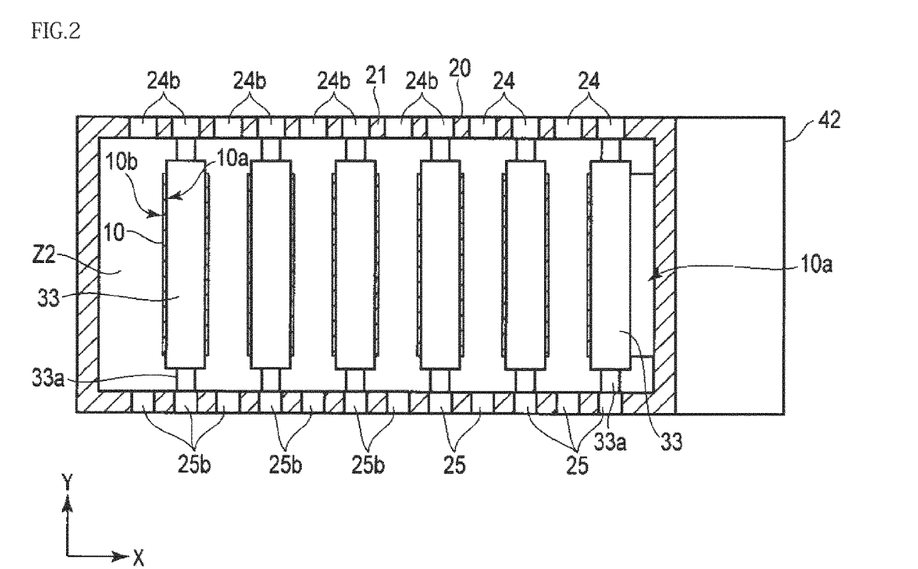
FIG. 2 is a cross sectional view of the film formation apparatus taken along the line II-II' of FIG. 1.
Figure 3:
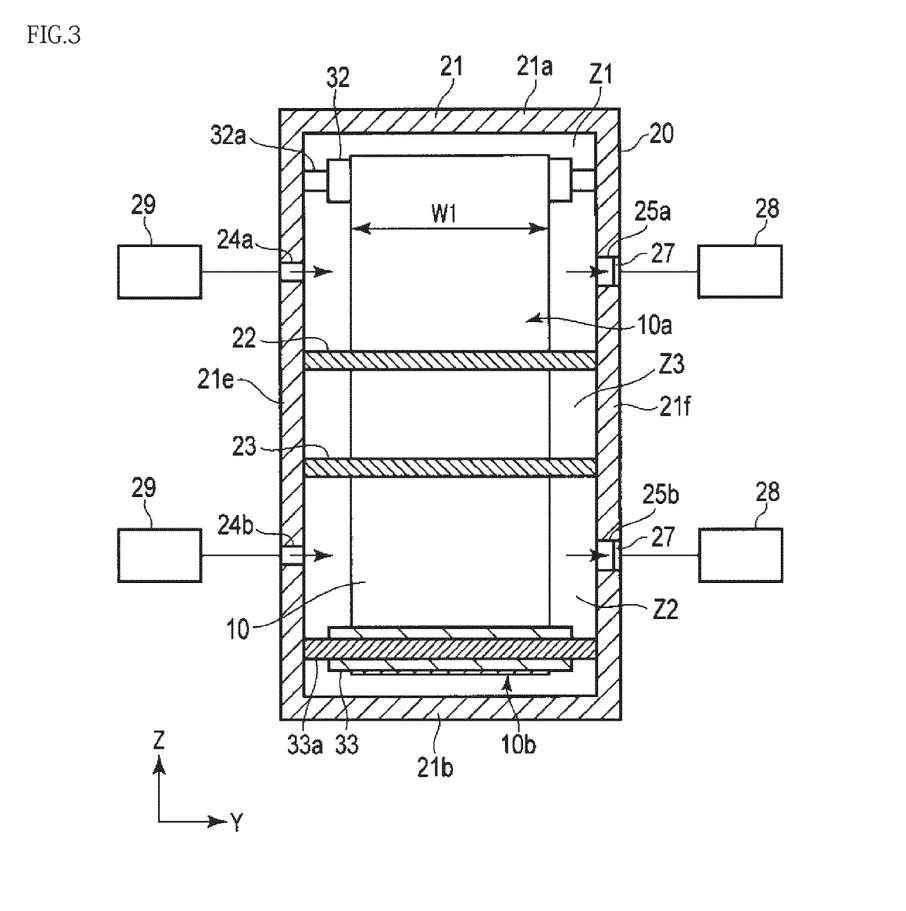
FIG. 3 is a cross sectional view of the film formation apparatus taken along the line III-III' of FIG. 1.
Figure 4:
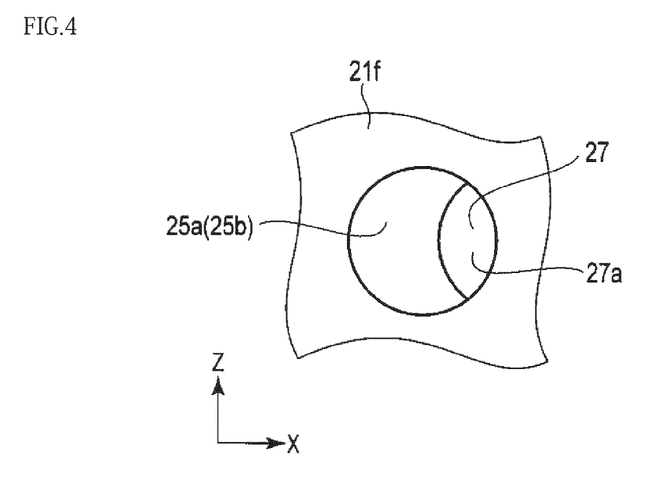
FIG. 4 is a side view of an opening adjustment mechanism of the film formation apparatus.
Figure 5:
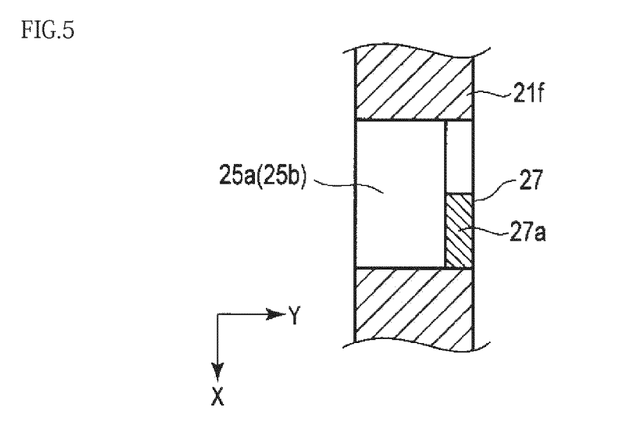
FIG. 5 is a cross sectional view of the opening adjustment mechanism.

With reference to FIGS. 1 to 5, a film formation apparatus 1 according to an embodiment of the present invention will be described. FIG. 1 is a cross sectional view of a film formation apparatus 1 according to a first representative embodiment, and shows a configuration inside a chamber 20 in a front view. FIG. 2 is a cross sectional view taken along the line II-II' of FIG. 1, and shows a configuration inside the chamber 20 in a side view. FIG. 3 is a cross sectional view taken along the line III-III' of FIG. 1, and shows a configuration inside the chamber 20 in a plan view. FIGS. 4 and 5 are a side view and a cross sectional view of an opening adjustment mechanism, respectively. The arrows X, Y, and Z in the figures indicate three directions which are perpendicular to one another. For convenience of description, the configuration shown in each figure is enlarged, reduced or omitted as appropriate.

The film formation apparatus 1 shown in FIGS. 1 to 3 is an ALD film formation apparatus 1 that forms a film on a substrate by means of atomic layer deposition (ALD). The film formation apparatus 1 is a space-divided type in which the chamber 20 is divided into a plurality of zones such that a single precursor or purge gas is supplied to each of the zones Z1 to Z3 while the substrate reciprocates among the zones Z1 to Z3.

In this embodiment, a flexible substrate 10 having a predetermined width (dimension in the Y direction) W1 and a thickness t1 is used as a substrate. A material of the substrate is selected from, but is not limited to, flexible materials such as a plastic film, plastic sheet, metal foil, metal sheet, paper, and non-woven cloth. The thickness of the substrate is, but is not limited to, in the range of 10 μm or more and 1000 μm or less.

The flexible substrate 10, which is a flexible sheet having a small thickness relative to the width, is supplied from a supply chamber 41 provided on one side of the chamber 20 and is transported to a recovery chamber 42 provided on the other side of the chamber 20 via a traveling path P which reciprocates among the plurality of divided zones Z1, Z2, and Z3 multiple times. A so-called roll-to-roll method is used for the transportation in which the sheet shaped flexible substrate 10 wound into a roll is fed out from a supply roll 31, transported while forming a film, and taken up by a recovery roll 34.

The film formation apparatus 1 includes the chamber 20 having the plurality of zones Z1, Z2, and Z3, a transportation unit 30 that transports the flexible substrate 10 along a predetermined traveling path P, and a control unit 50 that controls the operation of each component.

The chamber 20 has upper and lower walls 21a and 21b, and side walls 21c, 21d, 21e, and 21f, each having a rectangular shape. These walls 21a to 21f define an inner space of a cuboid shape. The supply chamber 41 and the recovery chamber 42 are disposed adjacent to one side wall 21c of the chamber 20 and the opposed side wall 21d, respectively.

In the chamber 20, partition walls 22 and 23 are disposed at two positions in the Z direction so as to form two surfaces extending along the XY plane. One partition wall 22 separates the first zone Z1 from the third zone Z3; the other partition wall 23 separates the third zone Z3 from the second zone Z2. These partition walls 22 and 23 divide the chamber 20 into three zones in the Z direction.

The chamber 20 is divided into the first zone Z1 that forms a first vacuum chamber into which a first precursor gas is introduced, the second zone Z2 that forms a second vacuum chamber into which a second precursor gas is introduced, and a third zone Z3 that is interposed between the first zone Z1 and the second zone Z2 and forms a third vacuum chamber into which a purge gas is introduced.

The first precursor introduced into the first zone Z1 is appropriately selected depending on a target deposition material. For example, trimethylaluminum is used when a material to be deposited on the flexible substrate 10 (target deposition material) is aluminum oxide.

The second precursor introduced into the second zone Z2 is appropriately selected depending on the target deposition material. For example, water, ozone, hydrogen peroxide, or atomic oxygen is used when the target deposition material is aluminum oxide.

As a purge gas introduced into the third zone Z3, an inert gas is used. The inert gas may be a gas appropriately selected from nitrogen, helium, argon and the like.

The partition walls 22 and 23 has a plurality of slit shaped passage openings 22a and 23a which allow the flexible substrate 10 to pass through. The passage openings 22a and 23a penetrate through the partition walls 22 and 23 in the Z direction. In this embodiment, 11 passage openings 22a and 23a are formed corresponding to the traveling path P which reciprocates six times.

The traveling path P has a zigzag shape which includes a plurality of curved paths which turns over in the first zone Z1 and the second zone Z2 and straight paths which extend in the Z direction between the curved paths in the first zone Z1 and the curved paths in the second zone. These paths are juxtaposed side by side in the X direction. The traveling path P reciprocates between the first zone Z1 and the second zone Z2 multiple times, by which each cycle of sequentially passing through the first zone Z1, the third zone Z3, and the second zone Z2 and going back to the third zone is repeated multiple times.

Supply ports 24 are disposed in the side wall 21e on one side of the chamber 20 in the Y direction. The supply ports 24 include supply ports 24a in the first zone Z1 for supplying the first precursor gas, and supply ports 24b in the second zone Z2 for supplying the second precursor gas. The supply ports 24a and 24b are located on one side in the width direction with respect to the traveling flexible substrate 10. The supply ports 24a and 24b communicate with a supply chamber 29 which is a supply unit of gas. Through the supply ports 24a and 24b, gas is supplied into the chamber 20. A plurality of supply ports 24a and 24b are disposed in the first zone Z1 and the second zone Z2 so as to correspond to the traveling path P which passes through the zones Z1 and Z2 multiple times.

In this embodiment, a total of 12 supply ports 24a and 24b are arranged side by side in the X direction such that each of the supply ports 24a and 24b correspond to each of the surfaces 10a and 10b of the substrate 10 in the plurality of straight paths which are arranged side by side in the X direction between guide rolls 32 and 33. The first precursor gas is introduced into the first zone Z1 through the supply port 24a in the first zone Z1, and the second precursor gas is introduced into the second zone Z2 through the supply port 24b in the second zone Z2.

A plurality of discharge ports 25 is disposed in the side wall 21f on the other side of the chamber 20 in the Y direction. The discharge ports 25 include discharge ports 25a disposed in the first zone Z1 so as to discharge the first precursor gas, and discharge ports 25b disposed in the second zone Z2 so as to discharge the second precursor gas. The discharge ports 25 are located on the other side in the width direction (Y direction) of the traveling flexible substrate 10. The discharge ports 25a and 25b are connected to a vacuum pump 28 which is a discharge unit. The gas inside the chamber 20 is externally discharged from the chamber 20 via the discharge ports 25a and 25b by operation of the vacuum pump 28. The plurality of discharge ports 25 is disposed so as to correspond to the traveling path P which passes through the first zone Z1 and the second zone Z2 multiple times. In this embodiment, a total of 12 discharge ports 25 are arranged side by side in the X direction such that each of the discharge ports 25 correspond to each of both surfaces 10a and 10b of the substrate in the plurality of straight paths which are arranged side by side in the X direction between guide rolls 32 and 33. That is, the first precursor gas in the first zone Z1 is externally discharged via the discharge ports 25a of the first zone Z1. The second precursor gas in the second zone Z2 is externally discharged via the discharge ports 25b of the second zone Z2.

The discharge ports 25a and 25b each have an opening adjustment mechanism 27 so that their opening states can be individually adjusted. As shown in FIGS. 4 and 5, the opening adjustment mechanism 27 has a shutter mechanism having a shutter 27a that changes an opening rate by partially closing the opening of the discharge ports 25a and 25b. In addition to that, the opening adjustment mechanism 27 may use a butterfly valve mechanism that opens and closes to change the flow of gas. The opening adjustment mechanism 27 can individually adjust the opening rates of the plurality of discharge ports 25a and 25b to adjust the conductance of gas and control the flow of gas, thereby adjusting the concentration of gas.

Further, gas in the first zone Z1 and the second zone Z2 is discharged by the vacuum pump 28 through the discharge ports 25a and 25b, respectively. The pressure in the third zone Z3 is held higher than the pressure in the first zone Z1 and the second zone Z2. Accordingly, the first precursor gas and the second precursor gas introduced in the first zone Z1 and the second zone Z2, respectively, are maintained under conditions that do not allow these gases to easily diffuse into the third zone Z3.

The transportation unit 30 includes the supply roll 31 disposed in the supply chamber 41, the plurality of first guide rolls 32 arranged in the first zone Z1 in the chamber 20, the plurality of second guide rolls 33 arranged in the second zone in the chamber 20, and the recovery roll 34 disposed in the recovery chamber 42.

The supply roll 31 is formed in a columnar or cylindrical shape and has a rotation shaft 31a extending in the Y direction. The flexible substrate 10 before film formation is wound around the outer peripheral surface of the supply roll 31. As the supply roll 31 rotates under control of the control unit 50, the flexible substrate 10 is fed out in the arrow direction shown in the figure.

The recovery roll 34 is formed in a columnar or cylindrical shape and has a rotation shaft 34a extending in the Y direction. As the recovery roll 34 rotates about the shaft controlled by the control unit 50, the flexible substrate 10 is recovered by the recovery roll 34 after film formation by being wound around the outer peripheral surface of the recovery roll 34.

The first guide rolls 32 and the second guide rolls 33 are formed in a columnar or cylindrical shape and have respective rotation shafts 32a and 33a extending in the Y direction. The plurality of first guide rolls 32 and the plurality of second guide rolls 33 are arranged side by side in the X direction on each of both sides of the chamber 20 in the Z direction. In this embodiment, six first guide rolls 32 and six second guide rolls 33 are each arranged side by side in the X direction. The rotation shafts 32a and 33a of the first guide rolls 32 and the second guide rolls 33 are rotatably supported at their ends by the side walls 21e and 21f of the chamber 20.

The second guide rolls 33 are each disposed at positions corresponding to intermediate positions between the adjacent first guide rolls 32 in the X direction. That is, the first guide rolls 32 and the second guide rolls 33 are located at alternate positions in the X direction. The first guide rolls 32 and the second guide rolls 33 have, for example, a clip type pinch mechanism that pinches the flexible substrate 10 by using a clip on both ends in the width direction.

Every time the flexible substrate 10 is wound around the outer peripheral surfaces of the first guide rolls 32 and the second guide rolls 33 which are located on both sides in the Z direction in an alternate manner, the traveling direction of the flexible substrate 10 is changed, that is, the flexible substrate 10 is curved and turned back. Accordingly, the traveling directions of the traveling paths P adjacent in the X direction are opposite to each other. The flexible substrate 10 is wound around the outer peripheral surfaces of the first guide rolls 32 and the second guide rolls 33 in an alternate manner in the chamber 20 so as to be guided along the traveling path P in a zigzag shape and transported while passing through the first zone Z1 and the second zone Z2 multiple times.

The number of times that the flexible substrate 10 passes through the first zone and the second zone Z2, that is, the number of reciprocations, is designed to be the same as the number of cycles required to obtain a desired film thickness by depositing a desired number of atomic layers on the flexible substrate 10.

The flexible substrate 10 is fed out from the supply roll 31 on one side in the X direction, guided by the first guide rolls 32 and the second guide rolls 33 to move along the traveling path P in a zigzag shape, and taken up by the recovery roll 34 on the other side in the X direction.

A film formation method using the film formation apparatus 1 according to the present embodiment will be described. The film formation method according to the present embodiment is an ALD film formation process of a space-divided type, in which thin layers grow in a layer-by-layer manner at an atomic level by alternately using a highly activated gas, which is referred to as a precursor, and a reactive gas, which is also referred to as a precursor.

The film formation method according to the present embodiment includes an adjustment operation for adjusting the opening states of the discharge ports 25, an introduction operation for introducing gas into the chamber, and a transportation operation for transporting the flexible substrate 10 along a predetermined traveling path P.

In the adjustment operation, the opening states of the plurality of discharge ports 25 are individually adjusted by using the opening adjustment mechanism 27 operated under control of the control unit 50 or by hand. As shown in FIG. 4, the opening rate is varied so as to change the flow of gas and adjust the distribution of gas in the chamber 20. Further, the opening rates that change the opening of the discharge ports 25a and 25b are determined as a specific value which is obtained, for example, by simulation or by repeating film formation and evaluation. Since appropriate opening rates are different for each of the discharge ports 25a and 25b depending on the shape of the chamber 20, the inner configuration of the zones Z1 to Z3 and the positions of the discharge ports 25a and 25b, the opening rates of the discharge ports 25a and 25b are appropriately adjusted for use. Accordingly, in the first zone Z1, the spatial distribution of the precursor which resides in different sites in the zone can be homogenized, thereby preventing reduction in the adsorption amount due to under-dosing.

In an operation of introducing gas, air purging is performed by operating the vacuum pump 28 by means of the control unit 50 or by hand with the discharge port 25 opened. Meanwhile, the first gas and the second gas are introduced into the first zone Z1 and the second zone Z2, respectively, by opening the supply ports 24a and 24b. Further, a purge gas is supplied into the third zone.

Thus, while gas is introduced into the first zone Z1 to the third zone Z3, the concentration of gas, pressure and distribution of gas in each zone are adjusted. Further, the pressure in the third zone Z3 is set to be higher than the pressure in the first zone Z1 and the pressure in the second zone Z2.

In the transportation operation, the control unit 50 rotates the supply roll 31, the recovery roll 34, and the plurality of guide rolls. The flexible substrate 10 moves from the supply chamber 41 provided on one side of the chamber 20 to the recovery chamber 42 provided on the other side of the chamber 20 along the zigzag shaped traveling path P which reciprocates among the plurality of divided zones Z1, Z2, and Z3 multiple times while flexing in the thickness direction.

When focusing on a portion of the flexible substrate 10 in the transportation direction, the flexible substrate 10 is fed out from the supply roll 31 and transported into the first zone Z1. Here, since the first precursor is introduced into the first zone Z1, the first precursor is adsorbed on both surfaces of the flexible substrate 10 while the flexible substrate 10 passes through the first zone Z1.

Further, the transportation speed of the flexible substrate 10 in the first zone Z1 is calculated on the basis of the saturated adsorption time and the transport distance so that a period of time in which the flexible substrate 10 passes through the first zone Z1 becomes longer than the period of saturated adsorption time.

Then, the flexible substrate 10 is transported to the third zone Z3 via the passage openings 22a formed on the partition wall 22. Then, while the flexible substrate 10 passes through the third zone Z3 along the traveling path P, the excess first precursor adsorbed onto the flexible substrate 10 is evaporated and purged. The transportation speed of the flexible substrate 10 in the third zone Z3 is calculated on the basis of the transport distance so as to ensure a sufficient purge time.

Then, the flexible substrate 10 is transported into the second zone Z2 via the passage openings 23a formed on the partition wall 23 disposed between the third zone Z3 and the second zone Z2.

The second precursor is introduced into the second zone Z2. While the flexible substrate 10 passes through the second zone Z2, a first precursor adsorbed on both surfaces of the flexible substrate 10 reacts with the second precursor, and thus an intended thin film is produced. After the absorbed first precursor reacts with the second precursor in the second zone Z2, the flexible substrate 10 is again transported into the third zone Z3 through the passage openings 23a formed on the partition wall 23 disposed between the second zone Z2 and the third zone Z3.

The transportation speed of the flexible substrate 10 in the second zone Z2 is calculated on the basis of the reaction time and the transport distance so that a period of time in which the flexible substrate 10 passes through the second zone Z2 becomes longer than the period of reaction time.

Then, the flexible substrate 10 is again transported into the first zone Z1 via the passage openings 22a formed on the partition wall 22 disposed between the third zone Z3 and the first zone Z1.

The aforementioned steps constitute one cycle of atomic layer deposition. Through these steps in one cycle, one atomic layer is deposited on the flexible substrate 10. The cycle is repeated multiple times to thereby form an atomic layer deposition film with a desired film thickness on a surface of the flexible substrate 10. After the atomic layer deposition film with a desired film thickness is formed on the surface of the flexible substrate 10, the flexible substrate 10 is taken up by the recovery roll 34.

During repetition of the above cycles multiple times, the transportation speed of the flexible substrate 10 is set to be the lowest speed among the respective transportation speeds calculated on the basis of the period of time required to expose the flexible substrate 10 to the first zone Z1, the second zone Z2, and the third zone Z3, and the transport distance of the flexible substrate 10 passing through the respective zones.

According to the film formation apparatus 1 and the film formation method of this embodiment, the following effect can be obtained. That is, since the plurality of discharge ports 25 that can individually adjust the opening states are provided in the first zone Z1 and the second zone Z2, supply and discharge can be balanced, thereby adjusting the flow of gas. Accordingly, the distribution of gas concentration can be adjusted, thereby preventing excess supply or insufficient supply of the precursor. As a result, the film thickness can be homogenized by reducing failure in film formation due to insufficient supply of the precursor. On the other hand, excess supply of the precursor can be avoided, thereby optimizing the amount of raw material used and reducing waste, which is desirable in terms of cost and the environment. Furthermore, the possibility of gas infiltration or the amount of gas infiltrating into the adjacent zone can be reduced by avoiding excess supply of the precursor, which prevents unintended CVD growth.

Moreover, since the supply ports 24 and the discharge ports 25 are arranged at positions which correspond to the traveling paths P of the flexible substrate 10 arranged side by side or between the adjacent traveling paths P, gas distribution and film thickness distribution can be further homogenized.

Furthermore, since the same number of the supply ports 24 and the discharge ports 25 are disposed to oppose each other on both sides in the width direction of the flexible substrate 10, the flow of gas can be optimized, which is advantageous in homogenization of gas distribution and film thickness distribution.

Specifically, in the space-divided type ALD process, supply and discharge of gas are simultaneously performed. When the discharge speed is high, the gas moves to the discharge ports 25 after it is supplied from the supply ports 24 without being diffused to a large extent. Consequently, there may be an area in which the gas is not sufficiently supplied. According to the above embodiment, however, the plurality of supply ports 24 and the discharge ports 25 are disposed so that the flow and distribution of the gas is adjusted. This prevents insufficient supply and excess supply of the gas. Further, since the supply ports 24 and the discharge ports 25 are disposed to oppose each other on both sides in the width direction of the flexible substrate 10 which travels in each zone, the substrate does not disturb the flow, allowing the gas to be uniformly distributed in the zones Z1 and Z2. Moreover, since the flow of gas can be optimized, the inner space of the chamber 20 can be effectively used, reducing the size of the film formation apparatus 1.

It should be noted that the present invention is not limited to the above embodiment. Although the above embodiment is described by illustrating a web coating technique performed on the flexible substrate 10, the invention is not limited thereto. For example, a transportation/continuous film formation process may also be used, in which a substrate on which a film is formed as well as the flexible substrate 10 is continuously transported on a flexible sheet or on a partially flexible tray.

Although the plurality of discharge ports 25 are formed in each of the first zone Z1 and the second zone Z2 in the above embodiment, the invention is not limited thereto. The plurality of discharge ports 25 may be disposed in either the first zone Z1 or the second zone Z2 depending on the types of the precursor used. Alternatively, the plurality of discharge ports may be disposed in the third zone Z3 in addition to the first zone Z1 and the second zone Z2, which produces the same effect as that in the above embodiment. Further, depending on the type of the precursor used, pressure reduction can be performed by connecting a vacuum pump to the third zone Z3.

In the above embodiment, the discharge ports 25 are disposed between the adjacent paths of the traveling path P arranged side by side in the X direction. However, the invention is not limited thereto, and the discharge ports 25 may be disposed at positions that overlap the traveling path P of the flexible substrate 10 as seen in the width direction, that is, positions on the path that the substrate passes through. In this case as well, discharge ports 25 that can adjust their openings are distributed, corresponding to the traveling path P that the substrate passes through multiple times. Accordingly, the flow of gas is controlled and the concentration of gas can be easily homogenized.

It should be noted that the present invention is not limited to the above embodiment, and various modifications can be made without departing from the spirit of the present invention. Further, the specific configuration and material of each component are not limited to the examples shown in the above embodiment, and may be modified as appropriate.

REFERENCE SIGNS LIST

1 . . . ALD film formation apparatus (film formation apparatus)
10 . . . flexible substrate (substrate)
20 . . . chamber
24 (24a, 24b) . . . supply port
25 (25a, 25b) . . . discharge port
27 . . . opening adjustment mechanism
27a . . . shutter
28 . . . vacuum pump (discharge unit)
29 . . . supply chamber (supply unit)
30 . . . transportation unit
31 . . . supply roll
32, 33 . . . guide roll (guide unit)
34 . . . recovery roll
41 . . . supply chamber
42 . . . recovery chamber
50 . . . control unit
Z1, Z2, Z3 . . . zone

What is claimed is:

1. A film formation apparatus, comprising:
a chamber that includes a plurality of zones comprising a first zone, a second zone and a third zone positioned between the first zone and the second zone, the first zone and the third zone are separated by a first partition wall, the second zone and the third zone are separated by a second partition wall, wherein each of the first and the second partition walls includes a plurality of openings; and
a transportation unit that transports a substrate along a transportation path so as to pass through each of the plurality of zones in the chamber multiple times by passing through each of the openings of the first and the second partition walls,
wherein the first zone contains a first gas and the second zone contains a second gas and wherein each of the first zone and the second zone contains a plurality of discharge ports along a transportation direction of the substrate, the discharge port discharges the gas located in the respective zone into vacuum, each of the discharge ports can individually adjust to an opening state, wherein the substrate has a first surface and a second surface, which is opposite to the first surface, each of the first zone and the second zone comprises a plurality of supply ports that supply the respective gas into the zones, and,
wherein the plurality of supply ports and the plurality of discharge ports are disposed along the transportation path of the substrate at positions on opposite sides of the chamber to each other and further such that, when the substrate is transported from the first zone to the second zone and form the second zone to the first zone, the line of gas flow from each supply port to a respective discharge port directly faces only one of the first surface and the second surface of the substrate.

2. The film formation apparatus of claim 1:
wherein the substrate is a flexible sheet,
wherein each of the first gas and the second gas is a precursor gas for atomic layer deposition, and
wherein the transportation path is such that a movement direction of the substrate is capable of being alternated through the plurality of zones multiple times.

3. The film formation apparatus of claim 1, wherein a number of the discharge ports in each of the first zone and the second zone corresponds to a number of times that the substrate passes through the respective zone in one direction.

4. The film formation apparatus of claim 1:
further comprising a guide section that guides the substrate along a zigzag shaped path such that a movement direction of the substrate is capable of being alternated through the plurality of zones multiple times,
wherein the substrate is a flexible sheet having a small thickness relative to a width dimension in a cross section perpendicular to the transportation direction, and is transported from a supply unit provided on a first side of the chamber to a recovery unit provided on a second side of the chamber, which is opposite to the first side of the chamber along the transportation path, and
wherein each of the first zone and the second zone comprises a plurality of supply ports that supply the respective gas into the zone, the supply ports are disposed on a third side of the chamber in a width direction perpendicular to the transportation direction of the substrate, and the discharge ports are disposed on a fourth side of the chamber, which is opposite to the third side in the width direction.

5. The film formation apparatus of claim 1, wherein the third zone contains an inert gas.

6. The film formation apparatus of claim 5, wherein a gas pressure in the third zone is higher than a gas pressure in the first zone and a gas pressure in the second zone.

7. The film formation apparatus of claim 1, wherein the chamber comprises a plurality of first guide rolls and a plurality of second guide rolls arranged respectively in the first zone and in the second zone in an alternate manner, wherein the substrate is wound around a peripheral surface of each guide roll of the plurality of the first guide rolls and each guide roll of the plurality of the second guide rolls, so that the transportation direction of the substrate is curved and turned back around each guide roll of the plurality of the first guide rolls and each guide roll of the plurality of the second guide rolls, wherein for each guide roll of the plurality of the first guide rolls, the plurality of discharge ports contains a discharge port positioned between the guide roll and the first partition wall and for each guide roll of the plurality of the second guide rolls, the plurality of discharge ports contains a discharge port positioned between the guide roll and the second partition wall.

8. The film formation apparatus of claim 7, wherein the chamber comprises a supply roll provided on a first side of the chamber to a recovery roll provided on a second side of the chamber, which is opposite to the first side of the chamber along the transportation path, wherein the substrate is transported from being wound around an outer peripheral surface of the supply roll to being wound around an outer peripheral surface of the peripheral roll.

9. The film formation apparatus of claim 8, wherein each of the first zone and the second zone comprises a plurality of supply ports that supply the respective gas into the zone, the supply ports are disposed on a third side of the chamber in a width direction perpendicular to the transportation direction of the substrate, and the discharge ports are disposed on a fourth side of the chamber, which is opposite to the third side in the width direction, wherein each of the supply ports faces only one of the first surface and the second surface of the substrate when the substrate is transported from the first zone to the second zone and when the substrate is transported from the second zone to the first zone.

\* \* \* \* \*